(12) United States Patent
Kondo (10) Patent No.: US 6,469,377 B1
(45) Date of Patent: Oct. 22, 2002

(54) SEMICONDUCTOR DEVICE (75) Inventor: Yoichiro Kondo, Chime (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/842,938

(22) Filed: Apr. 25, 2001

(30) Foreign Application Priority Data

Apr. 25, 2000 (JP) ........................................ 2000-124353

(51) Int. Cl.[7] .......................... H01L 23/02; H01L 23/34; H01L 23/48; H01L 23/52; H01L 29/40; H01L 21/50
(52) U.S. Cl. ..................... 257/686; 257/725; 257/777; 438/109; 438/125
(58) Field of Search ................................ 257/686, 725, 257/777; 438/109, 125, FOR 368, FOR 426

(56) References Cited

U.S. PATENT DOCUMENTS 6,049,123 A * 4/2000 Burns .......................... 257/686
6,102,710 A * 8/2000 Beilin et al. .................. 439/67

* cited by examiner

*Primary Examiner*—David E. Graybill
(74) *Attorney, Agent, or Firm*—Hogan & Hartson, LLP

(57) ABSTRACT

To provide a semiconductor device with a three-dimensional mounting module using a flexible circuit substrate which is easy to assemble a three-dimensional structure and is excellent in the workability in repair work (or re-work).

[MEANS FOR SOLUTION] A flexible circuit substrate 11 has mounting regions 111, 112 and 113 on which electronic components 121, 122 and 123 are mainly mounted, respectively, and other electronic components 124 and 125 are also mounted. The flexible circuit substrate 11 is structured in such a manner that the mounting regions 111~113 are folded on top of the other over the base region 110 in a predetermined order (f1~f3). An integrated spacer 13 has thick regions 131 and thin regions 132, and is superposed and affixed to the flexible circuit substrate 11 as indicated by arrows with broken lines, and supports the electronic components 121~125 stacked in layers. Fixing bosses 134 and aperture sections 14 to be coupled therewith are provided to facilitate positioning.

20 Claims, 5 Drawing Sheets

SEMICONDUCTOR DEVICE

TECHNICAL FIELD

The present invention relates to a semiconductor device using a flexible circuit substrate, and more particularly to a semiconductor device having a three-dimensional mounting module that is inexpensive, smaller in size, and lighter in weight.

BACKGROUND TECHNOLOGY

Flexible circuit substrates have the advantage of being soft and deformable unlike rigid circuit substrates. Accordingly, they are advantageous in high-density mounting of ICs and reducing the size of modules. In other words, flexible circuit substrates are used for TCP (tape carrier packages), COP (Chip On Flexible or Film) and the like, and particularly they are indispensable for reducing the size of a variety of media apparatuses.

Also, the system LSI (Large-Scale integration) technology is important in the realization of smaller, thinner and lighter media apparatuses. System LSIs are steadily advancing the technology towards the implementation of one-chip while incorporating LSIs of peripheral circuits. However, the development of a system LSI requires a long time and results in an increased cost of the chip because of mixing of processes of different types. For this reason, requirements for a short delivery time and low cost for media apparatuses have not been met.

For the reasons described above, there are stronger demands in system function mounting mainly composed of three-dimensional mounting, and integration of a system LSI and the mounting technology is becoming more important. Frequency (high speed) and delivery (short-term delivery) determine the degree of growth in the media apparatus industry. Accordingly, the connection length and wiring length of an LSI to be built in must be shortened as much as possible by utilizing the mounting and packaging technologies. For this reason, three-dimensional mounting modules have been subject to various contrivances and have come into the stage of practical use.

For example, conventionally, a three-dimensional mounting module has the following structure that has been placed in practice or in the stage of being placed in practice. First, (A): TCPs (Tape Carrier Packages) are stacked in layers, and connection between the stacked chip layers is achieved by outer leads of the TCPs. (B): A frame body for wiring is disposed between layers of TCPs, and connection between the layers of the TCPs is achieved by the frame body. (C): Chips are stacked in layers, and the stacked chip layers are connected by conduction material. Also, other techniques are available.

According to the conventional technology, stacked chip layers need to be electrically connected through certain interposers. The interposers may have a connection structure in which they are externally connected in a manner described above in (A) or (C), or a connection structure in which they are internally connected in a manner described above in (B). In any of these cases, a structure as a three-dimensional mounting module needs to be established first, then the electrical operation thereof as a module product is made and measurement and examination thereof can be conducted.

If a three-dimensional mounting module is determined to be defective as a result of the measurement and examination, repair work (or re-work) to correct the defect is conducted. In other words, in a three-dimensional mounting module in the process of assembling a three-dimensional structure, it is important to provide a connection structure, which takes into consideration processes of how common electrodes and non-common electrodes are treated and how repair works (re-words) are conducted. In this respect, the conventional technology has the problem of longer processing time and higher costs.

The present invention has been made in view of the problems described above, and it is an advantage of the present invention to provide a semiconductor device having a three-dimensional mounting module structure using a flexible circuit substrate that is excellent for repairing and assembling the module into a three-dimensional structure.

SUMMARY OF THE INVENTION

A semiconductor device in accordance with the present invention includes a flexible circuit substrate having a base region and one or more mounting regions continuously provided at a peripheral edge of the base region, wherein the mounting regions are folded over the base region; electronic components mounted corresponding to the mounting regions; a stacked layered support body including a thick first region and a foldable thin second region that is formed with the first region in one piece, each of the regions having a specified outer frame provided in a manner to protect each of the electronic components; a bonding member for integrating the stacked layered support body and the flexible circuit substrate in one piece, protruded sections provided at specified locations of the thick first region of the stacked layered support body, and aperture sections provided at specified locations in a rear surface side of the flexible circuit substrate to be coupled with the protruded sections, wherein, when the mounting regions of the flexible circuit substrate are folded together with the stacked layered support body over the base region, the protruded sections and the aperture sections are coupled and fixed together at an area where the thick first regions are superposed on top of the other through the flexible circuit substrate.

In accordance with the semiconductor device of the present invention, at the time when the electronic components are mounted on the flexible circuit substrate, an operation as a module product can be conducted. Accordingly, measurement and examination can be conducted before they are assembled into a three-dimensional mounting module.

Furthermore, the stacked layered support body for assembling a three-dimensional mounting module is formed in one piece and mounted on the flexible circuit substrate in one area. Then, the mounting regions are folded and affixed together with the stacked layered support body on top of the other. As a result, a three-dimensional mounting module is realized in a fewer number of steps. In this instance, the protruded section and the aperture section that are pre-installed are coupled together, whereby positioning of the layers to be stacked is facilitated, and the assembly accuracy is improved.

BRIEF DESCRIPTION OF THE DRAWINGS

FIGS. 4(a) and (b) show a structure of a semiconductor device in accordance with a second embodiment of the present invention, respectively, wherein FIG. 4(a) shows a plan view before assembly, and FIG. 4(b) schematically shows a cross-sectional view of a characteristic general structure of a three-dimensional mounting module after assembly.

FIGS. 5(a) and (b) show a structure of a semiconductor device in accordance with a third embodiment of the present invention, wherein FIG. 5(a) shows a plan view before assembly, and FIG. 5(b) schematically shows a cross-sectional view of a characteristic general structure of a three-dimensional mounting module after assembly.

DETAILED DESCRIPTION OF THE PREFERRED EMBODIMENTS

Figure 1:
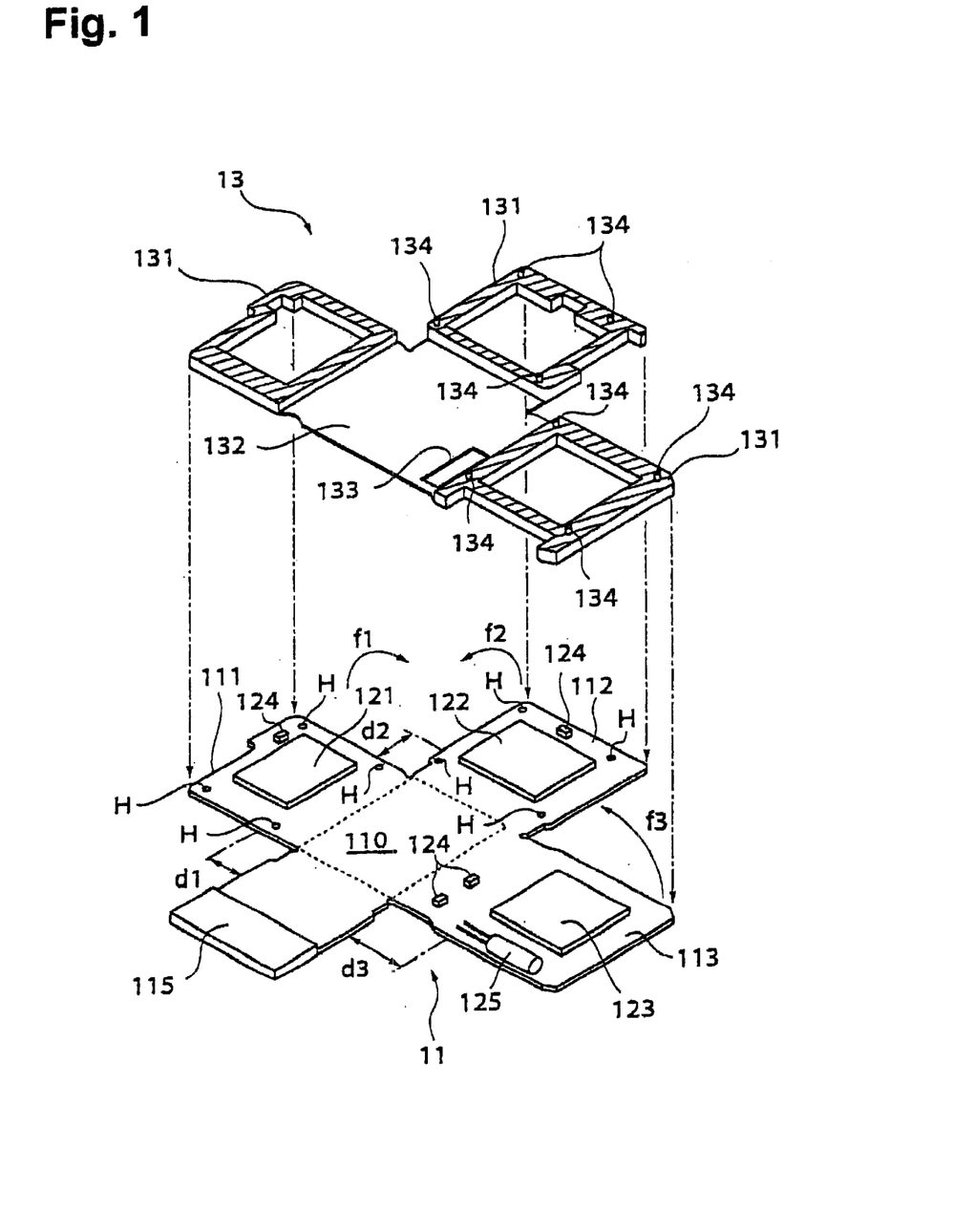
FIG. 1 shows a prospective view of a structure of a semiconductor device in accordance with a first embodiment of the present invention.
Figure 2:
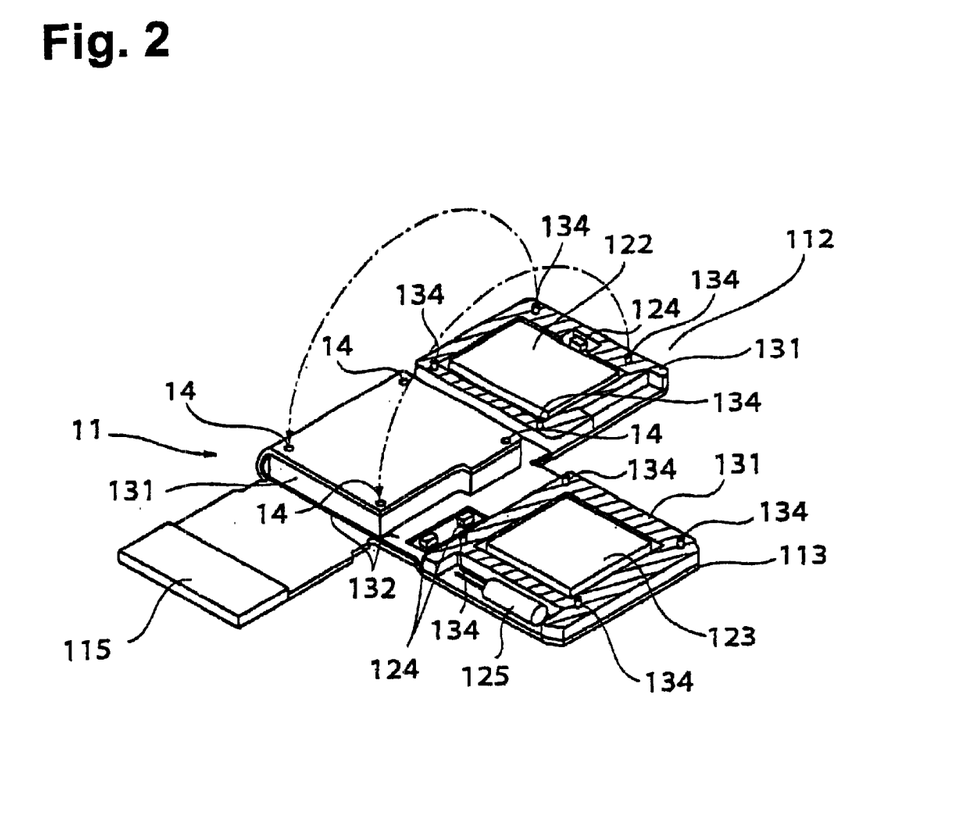
FIG. 2 shows a perspective view of a characteristic assembling configuration with the structure shown in FIG. 1.

FIG. 1 shows a prospective view of a structure of a semiconductor device in accordance with a first embodiment of the present invention. FIG. 2 shows a perspective view of a characteristic assembly configuration with the structure shown in FIG. 1. As shown in FIG. 1, a flexible circuit substrate 11 has a generally square base region 110 indicated by broken lines, mounting regions 111, 112 and 113 that are continuously provided along the periphery of the base region 110, and predetermined conduction patterns (not shown) formed below a protection film. Also, an external terminal section 115 is provided at the periphery of the base region 110 in a region where the mounting regions are not provided. The external terminal section 115 in this example is a connector terminal.

In the flexible circuit substrate 11, electronic components 121, 122 and 123 respectively corresponding to the mounting regions 111, 112 and 113 are face-down mounted. The electronic components 121, 122 and 123 may be composed of any of various devices such as memory chips, system LSI chips, control units and the like.

The face-down mounting of the electronic components 121, 122 and 123 can be conducted by, for example, solder-bonding bump electrodes of each of the electronic components and predetermined conduction patterns on the flexible circuit substrate 11. Also, connection by an ACF (anisotropic conduction film) can be considered. More specifically, an ACF (anisotropic conduction film) is placed between the bump electrodes of each of the electronic components and the predetermined conduction patterns on the flexible circuit substrate 11 and they are heat-bonded together. As a result, conduction particles in the ACF achieve electrical connection between each of the electronic components 121, 122 and 123 and the conduction patterns on the flexible circuit substrate 11. In addition, a variety of other methods may be employed. For, example, ACP (anisotropic conduction paste) bonding, NCP bonding that attains electrical connection by the shrinking force of an insulation resin, metal eutectic bonding of bumps is between gold and gold, gold and tin or the like. Also, in some cases, a face-up mounting using the wire-bonding method can be applied. Furthermore, extremely thin IC packages can also be mounted. Therefore, electronic components are not limited to particular mounting configurations.

Also, some electronic components (peripheral elements) in small size relating to the electronic components 121, 122 and 123 are mounted. For example, electronic components 124 may be capacitors, chip resistors or the like, and an electronic component 125 may be a crystal or the like.

The flexible circuit substrate 11 is formed from a soft material such as polyimide that can be freely bent. The flexible circuit substrate 11 is formed such that the mounting regions 111~113 can be folded on top of the other in a predetermined order (f1~f3) over the base region 110. Therefore, distances d1~d3 are set different from one another in consideration of the bending distances required for bending the mounting regions 111~113.

An integrated spacer 13 is mounted on the flexible circuit substrate 11. The integrated spacer 13 is superposed over and affixed to the flexible circuit substrate as indicated by arrows with broken lines, such that they can support stacked layers of the electronic components when the mounting regions 111~113 are folded on top of the other. The integrated spacer 13 has thick regions 131 and a thin region 132.

The thick regions 131 of the integrated spacer 13 are provided to protect the stacked layers of the electronic components 121~123, and the other electronic components 124 and 125. Each of the thick regions 131 has a configuration that surrounds, for example, each of the corresponding electronic components 121~123, respectively. Also, with respect to an electronic component in small size (e.g., 125) mounted adjacent to an edge, the thick region can have a configuration that partially extends along the periphery thereof. In any case, the thick regions 131 may preferably have outer frame shapes that can be superposed over the base region 110 since they are stacked over the base region 110.

The thin region 132 of the integrated spacer 13 extends over the base region 110, and is formed in one piece with the thick regions 131. The thin region 132 forms a region that can be bent at least along the periphery of the base region 110. Also, an opening section 133 may be provided such that mounting of the electronic component 124 is not prevented.

The integrated spacer 13 can be composed of, for example, a formed product of polyimide resin in consideration of heat resistance. The thick regions 131 have a thickness to the extent that the electronic components (121~123 and the like) to be mounted are not prevented from being stacked in layers. Also, the thin region 132 may preferably be as thin as possible because it includes a bending section, and may preferably have a thickness of about 0.1~0.2 mm, for example. If handling of the integrated spacer 13 is not difficult, the thin region 132 can be much thinner.

The integrated spacer 13 is affixed on its rear surface (not shown) to the flexible circuit substrate 11 through a bonding member such as a two-faced tape, adhesive or the like, such that it forms an integrated structure with the flexible circuit substrate 11.

Fixing bosses 134 are pre-installed at specified locations on the thick regions 131 of the integrated spacer 13. Also, as shown in FIG. 2, aperture sections 14 to be coupled with the fixing bosses 134 are provided in rear surface of the mounting regions 111 and 112 of the flexible circuit substrate 11 at locations corresponding to the thick region 131 of the integrated spacer 13.

FIG. 2 shows the aperture sections 14 provided on the rear surface side of the mounting region 111, which are coupled with the fixing bosses 134 on the mounting region 112, as indicated by arrows with broken lines. Although not shown, the aperture sections 14 to be coupled with the fixing bosses 134 on the mounting region 113 are provided on the rear surface side of the mounting region 112.

Each of the aperture sections 14 requires a depth in which each of the fixing bosses 134 is inserted, and therefore it is formed in a manner that it passes through the flexible circuit substrate 11 (a through hole H shown in FIG. 1) and penetrates into a part of the thick region 131 from its rear surface side. Furthermore, bonding members such as adhesive, two-faced tapes or the like are provided on stacking layer fixing sides (hatched areas) of the thick regions 131. By these members, the electronic components 121~123 (including the other small-sized electronic components) are successively stacked in layers. In this instance, the fixing bosses 134 and the aperture sections 14 are coupled and affixed with one another in area where the thick regions 131 of the integrated spacer 13 are stacked on top of the other through the flexible circuit substrate 11.

Figure 3:
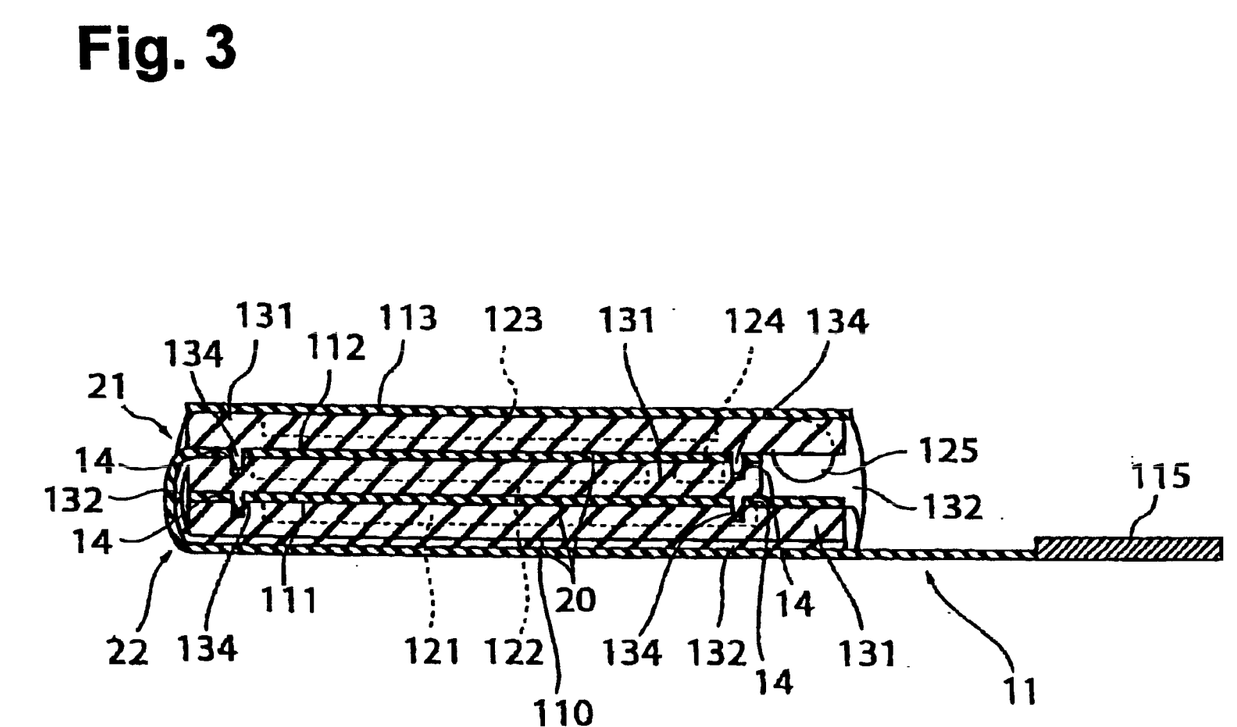
FIG. 3 shows a cross-sectional view of an assembled configuration of the semiconductor device of FIG. 1.

FIG. 3 shows a cross-sectional view of an assembled configuration of the semiconductor device of FIG. 1. For ready understanding of the assembled state, the flexible circuit substrate folded at the front thereof is also shown by phantom lines. More specifically, in an embodiment shown here, the mounting regions 111, 112 and 113 are successively folded over the base region 110 from the respective directions, such that the electronic components 121, 122 and 123 and the other peripheral electronic components 124 and 125 are stacked and affixed on top of the other in a three-dimensional configuration.

The integrated spacer 13 is affixed to the flexible circuit substrate 11 through, for example, a two-faced tape. Furthermore, adhesive regions (for example, two-faced tapes) 20 provided on the thick regions 131 contribute to affixing the stacked layers. As a result, the electronic components 121, 122 and 123 and the other peripheral electronic components 124 and 125 are surrounded and protected by the respective thick regions 131.

A thin region 132 of the integrated spacer 13 supports bending regions of the flexible circuit substrate 11, and plays a role of protecting the flexible circuit substrate 11 particularly with respect to its bending end regions 21 and 22 that can be sharply bent.

Furthermore, the fixing bosses 134 and the aperture sections 14 engage with one another to thereby contribute to folding and positioning of the mounting regions of the flexible circuit substrate 11 with the integrated spacer 13. A bonding member may be provided between the fixing bosses 134 and the aperture sections 14.

In accordance with the first embodiment of the present invention, at the time when the electronic components (121~123 and others) are mounted on the flexible circuit substrate 11, an operation as a module product can be conducted. Accordingly, measurement and examination can be conducted before they are assembled into a three-dimensional mounting module.

Moreover, the integrated spacer 13 that can be assembled into a three-dimensional mounting module can be mounted on the flexible circuit substrate 11 in one lot. Then, the mounting regions 111~113 together with the integrated spacer 13 are folded and affixed on top of the other to realize a three-dimensional mounting module of the electronic components (121~123 and others).

It is noted that, in the first embodiment, the fixing bosses 134 are not provided on the thick regions 131 that are initially folded over the base region 110. However, they may be provided. In such an instance, apertures to be coupled with the fixing bosses 134 are needed in the thin region 132 of the integrated spacer 13 over the base region 110.

By doing so, the accuracy in assembly positions is improved when the mounting regions are initially stacked. However, when a three-dimensional module having such a structure is mounted on a main substrate, it is important to make an arrangement so that the fixing bosses 134 that are present on the base region 110 do no prevent the mounting work. For example, as a countermeasure, the bosses 134 are made to be low such that they do not protrude from the base region 110. Alternatively, recesses (recesses) may be provided in the main substrate at locations corresponding to the bosses 134 to avoid (or alleviate) collision with the bosses 134.

Moreover, in the embodiment described above, apertures 14 are not provided on the thick regions 131 in the mounting region 113 that is lastly folded over the base region 110. However, they may be provided in a manner to pass through the flexible circuit substrate 11. In this case, they contribute to positioning when a heat sink or the like is provided on the three-dimensional module.

As a result, the assembly characteristics (readiness and accuracy in assembly) of a three-dimensional mounting module is substantially improved, and the number of work steps can be reduced. This results in an excellent workability in repair work (or re-work). The assembly characteristics is improved and the number of parts is reduced compared to spacers of a separated type. This contributes to the reduction of costs. Also, due to the improved positioning accuracy attained by the engagement between the fixing bosses 134 and the aperture sections 14, there is provided an advantage in that a product can be designed with much smaller clearances. As a result, a more compact three-dimensional mounting module can be attained.

In the three-dimensional mounting module in accordance with the present invention, the electronic components (121~123 and others) are mounted on the flexible circuit substrate 11, and folded over on top of the other together with the flexible circuit substrate 11 and the integrated spacer 13. This configuration substantially loosens the restrictions on the size of ICs and placements of the pads, compared to a stacked package in which IC chips are stacked on top of the other. In a stacked package, there are a variety of restrictions on the size of ICs that are combined, IC terminal positions and the like. In contrast, a three-dimensional mounting module in accordance with the present invention has a greater degree of freedom in selection and combination of different types of ICs, and provides an electrically most optimized module in view of the fact that a plurality of peripheral elements can also be mounted.

Figure 4:
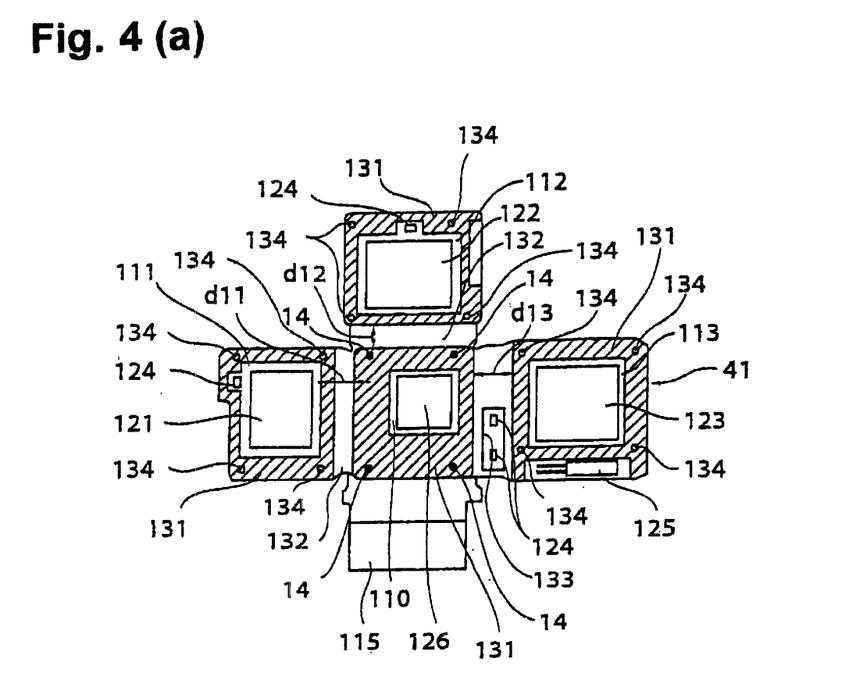

FIGS. 4(a) and (b) show a structure of a semiconductor device in accordance with a second embodiment of the present invention, respectively, wherein FIG. 4(a) shows a plan view before assembly, and FIG. 4(b) schematically shows a cross-sectional view of a characteristic general structure of a three-dimensional mounting module after assembly.

For ready understanding of the assembled state, the flexible circuit substrate folded at the front thereof is also shown by phantom lines. Elements that are the same as those of the first embodiment are referred to by the same reference numbers and the description thereof is omitted.

In the second embodiment of the present invention, a flexible circuit substrate 41 is different from that of the first embodiment. As shown in the figure, an electronic component 126 is also mounted on the base region 110 of the flexible circuit substrate 41. Accordingly, the integrated spacer 13 is also provided with a thick region 131 on the base region 110 corresponding to the electronic component 126.

Also, in view of the fact that the electronic components 121~123 are successively stacked over the electronic component 126 in layers, in the integrated spacer 13, distances d11~d13 between the thick region 131 on the base region 110 and the thick regions 131 on the mounting regions 111~113, respectively are made different from one another.

Furthermore, fixing bosses 134 are provided at specified locations on the thick region 131 of the integrated spacer 13 over the mounting region 111. Also, aperture sections 14 to be coupled to the fixing bosses 134 are provided in the thick region 131 of the integrated spacer 13 provided on the base region 110.

With this structure, the flexible circuit substrate 41 is folded over in a predetermined order together with the integrated spacers 13 (the thick regions 131). In other words, the electronic components 121~125 are stacked and fixed in layers in a similar manner as described in the first embodiment (see FIG. 4(b)).

Figure 5:
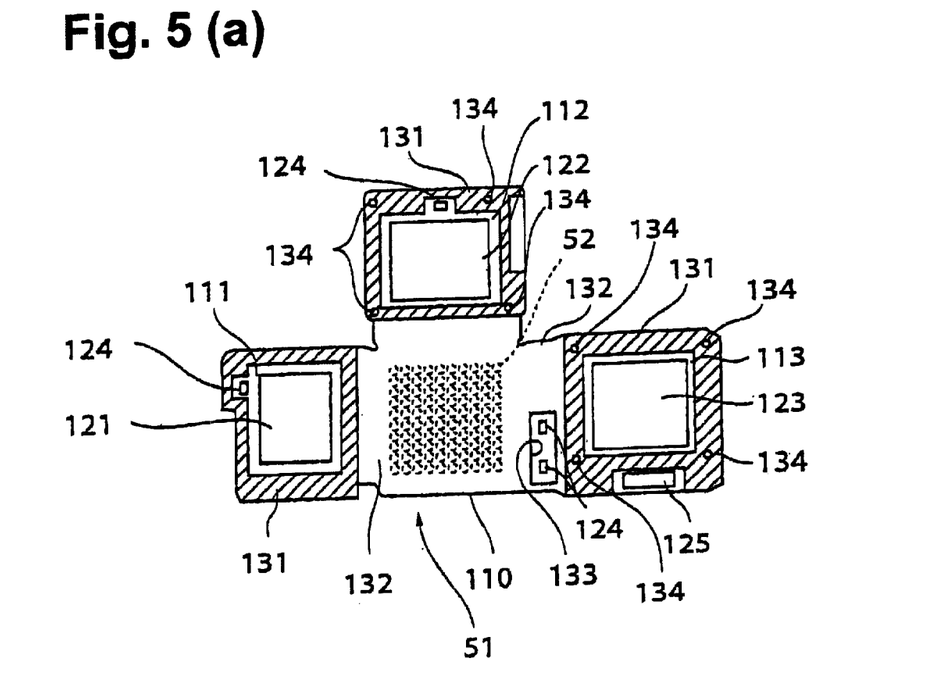

FIGS. 5(a) and (b) show a structure of a semiconductor device in accordance with a third embodiment of the present invention, wherein FIG. 5(a) shows a plan view before assembly, and FIG. 5(b) schematically shows a cross-sectional view of a characteristic general structure of a three-dimensional mounting module after assembly. For ready understanding of the assembled state, the flexible circuit substrate folded at the front thereof is also shown by phantom lines. Elements that are the same as those of the second embodiment are referred to by the same reference numbers and the description thereof is omitted.

In the third embodiment of the present invention, a flexible circuit substrate 51 is different from that of the first embodiment. As shown in the figure, external terminal sections (for example, ball electrodes) 52 indicated by broken lines are provided on the rear surface of the base region 110 of the flexible circuit substrate 51. In other words, in this structure, the external terminal section 115 described in the first embodiment (in FIG. 1), which is a connector terminal, is replaced with an array type electrode (52).

End sections of the conduction patterns, which are equivalent to external terminals (not shown), are connected to the external terminal sections (ball electrodes) 52 through via patterns (not shown) in the main surface of the flexible circuit substrate 51 in which the mounting regions (111~113) are provided.

Also, an electronic component 125 is a crystal, which is an SMD (Surface Mount Device) type instead of a cylinder type described above. An SMD type can be subject to a reflow when a three-dimensional module is mounted on a main substrate by solder and therefore is reliable.

The integrated spacer 13 is provided with thick regions 131 in accordance with the electronic components 121~125. Accordingly, the flexible circuit substrate 51 is folded over on top of the other in a predetermined order together with the integrated spacer 13 (with the thick regions 131). Namely, the fixing bosses 134 and the aperture sections 14 are coupled together and the electronic components 121~125 are stacked and affixed in layers in a similar manner as described in the first embodiment (see FIG. 5(b)).

The electronic components 121~125 may be affixed in advance to the flexible circuit substrate 61 by an adhesive means such as a thermosetting type adhesive depending on the requirements. This would contribute toward preventing, for example, the electronic components 125 and 125 that are solder-bonded from falling off, when they are mounted on a main substrate by a reflow solder-bonding as a three-dimensional module. The adhesive means is not necessarily required because it depends on the temperature condition and the specific gravity of each electronic component. In any case, specified electronic components are preferably be bonded without interfering with the spacer 13.

In one possible structure, mounting regions may be provided along all of the four edges of the periphery of the base region 110. In such a case, electronic components are stacked in layers in a predetermined order together with an integrated spacer including thick regions and a thin region and affixed together in the same manner as described in the first embodiment.

Both of the second and third embodiments described above are made in pursuit of a high-density mounting structure. In accordance with these embodiments, at the time when the electronic components are mounted on the flexible circuit substrate 41 or 51, an operation as a module product can likewise be conducted. Accordingly, measurement and examination can be conducted before they are assembled into a three-dimensional mounting module.

Moreover, the integrated spacer 13 that can be assembled into a three-dimensional mounting module can be mounted on the flexible circuit substrate 41 or 51 in one lot. Then, the mounting regions are folded together with the integrated spacer 13 and affixed on top of the other. In this instance, since the fixing bosses 134 and the aperture sections 14 that are pre-installed engage one another, the positioning work becomes substantially easy.

It is noted that the number and locations of the fixing bosses 134 and the aperture sections 14 are not particularly limited, and they can be provided at any locations necessary for positioning or affixing. As described above in the first embodiment, fixing bosses for aligning the positions thereof with respect to the base region 110 may be provided on the thick region 131 that is initially folded over the base region 110, and aperture sections may be provided on the base region. However, as described above, it is important to provide a structure in which the fixing bosses 134 existing on the base region 110 do not hinder the mounting work.

Furthermore, apertures that pass through the flexible circuit substrate 11 may be provided on the thick regions 131 in the mounting region that is lastly folded over the base region 110. As a result, they contribute to positioning when a heat sink or the like is provided on the three-dimensional module.

In accordance with the embodiments described above, due to the integrated spacer together with engagement of the fixing bosses and the aperture sections, the assembly characteristic (readiness and accuracy in assembly) is substantially improved, and a product can be designed with much smaller clearances. This provides a three-dimensional mounting module having an excellent workability in repair work (or re-work). The assembly characteristic is improved and the number of parts is reduced compared to spacers of a separated type. This contributes to the reduction of costs. Furthermore, a greater degree of freedom in combining different types of ICs is available and a most electrically optimized module can be obtained in view of the fact that a plurality of peripheral elements can be mounted.

As a result, there is provided a most electrically optimum semiconductor device with the high degree of freedom can be provided with a highly reliable three-dimensional mounting module using a flexible circuit substrate, in which the readiness and controllability are attained in assembling the high density three-dimensional mounting module, and an excellent workability in repair work (or re-work).

What is claimed is:

1. A semiconductor device comprising:
 a flexible circuit substrate having a base region and one or more mounting regions continuously provided at a peripheral edge of the base region, wherein the mounting regions are folded over the base region;

electronic components mounted corresponding to the mounting regions;

a stacked layered support body including a thick first region and a foldable thin second region that is formed with the first region in one piece, wherein each of the regions having a specified outer frame provided in a manner to protect each of the electronic components;

a bonding member for integrating the stacked layered support body and the flexible circuit substrate in one piece;

protruded sections provided at specified locations of the thick first region of the stacked layered support body; and aperture sections provided in at specified locations in a rear surface side of the flexible circuit substrate to be coupled with the protruded sections;

wherein, when the mounting regions of the flexible circuit substrate are folded together with the stacked layered support body over the base region, the protruded sections and the aperture sections are coupled and fixed together at an area where the thick first regions are superposed on top of the other through the flexible circuit substrate.

2. The semiconductor device according to claim 1, wherein the flexible circuit substrate further includes an external terminal region that is continuously provided along a periphery of the base region.

3. The semiconductor device according to claim 1, wherein the flexible circuit substrate further includes an external terminal region that is provided on a surface of the base region on its lower side.

4. The semiconductor device according to claim 1, wherein the stacked layered support has a structure that surrounds a periphery of each of the electronic components with respect to the first region.

5. The semiconductor device according to claim 1, wherein the stacked layered support body has a structure that partially follows along the periphery of each of the electronic components with respect to the first region.

6. The semiconductor device according to claim 1, wherein the base region is further equipped with a structure for mounting the electronic components, which is provided with a thick first region of the stacked layered support body corresponding to each of the electronic components to be mounted on the base region, and aperture sections on the thick first region to be engaged with the protruded sections.

7. The semiconductor device according to claim 1, wherein the electronic components are mounted face down.

8. The semiconductor device according to claim 7, wherein the face down mounting of the electronic components is performed by solder-bonding bump electrodes.

9. The semiconductor device according to claim 1, wherein the flexible circuit substrate is formed from a polyimide.

10. A semiconductor device comprising:

a flexible circuit substrate having a base region and one or more mounting regions continuously provided at a peripheral edge of the base region, wherein the mounting regions are folded over the base region;

electronic components mounted corresponding to the mounting regions;

a stacked layered support body including a thick first region and a foldable thin second region that is formed with the first region in one piece, wherein each of the regions having a specified outer frame provided in a manner to protect each of the electronic components;

means for integrating the stacked layered support body and the flexible circuit substrate in one piece;

protruded sections provided at specified locations of the thick first region of the stacked layered support body; and aperture sections provided in at specified locations in a rear surface side of the flexible circuit substrate to be coupled with the protruded sections;

wherein, when the mounting regions of the flexible circuit substrate are folded together with the stacked layered support body over the base region, the protruded sections and the aperture sections are coupled and fixed together at an area where the thick first regions are superposed on top of the other through the flexible circuit substrate.

11. A semiconductor device comprising:

a flexible circuit substrate having mounting regions on which electronic components are mounted, respectively, wherein the flexible circuit substrate is structured in such a manner that the mounting regions are folded on top of the other over a base region of the flexible circuit substrate in a predetermined order;

an integrated spacer having thick regions and thin regions are superposed and affixed to the flexible circuit substrate and supports the electronic components stacked in layers; and fixing bosses and aperture sections coupled therewith, provided to facilitate positioning.

12. A method for manufacturing a semiconductor device comprising:

providing a flexible circuit substrate having a base region and one or more mounting regions continuously provided to a peripheral edge of the base region, wherein the mounting regions is folded over the base region; p1 mounting electronic components in correspondence with the mounting regions;

forming a stacked layered support body including a thick first region and a foldable thin second region with the first region in one piece, wherein each of the regions having a specified outer frame provided in a manner to protect each of the electronic components;

integrating the stacked layered support body with the flexible circuit substrate in one piece with a bonding member;

providing protruding sections at specified locations of the thick first region of the stacked layered support body; and providing aperture sections in at specified locations in a rear surface side of the flexible circuit substrate to be coupled with the protruded sections;

wherein, when the mounting regions of the flexible circuit substrate are folded together with the stacked layered support body over the base region, the protruded sections and the aperture sections are coupled and fixed together at an area where the thick first regions are superposed on top of the other through the flexible circuit substrate.

13. The method according to claim 12, further comprising providing an external terminal continuously along a periphery of the base region of the flexible circuit substrate.

14. The method according to claim 12, further comprising providing an external terminal region on a surface of the base region on the lower side of the flexible circuit substrate.

15. The method according to claim 12, further comprising forming the stacked layered support with a structure that surrounds a periphery of each of the electronic components with respect to the first region.

16. The method according to claim 12, further comprising forming the stacked layered support body with a structure that partially follows along the periphery of each of the electronic components with respect to the first region.

17. The method according to claim 12, further comprising providing the base region with a structure for mounting the electronic components, which is provided with a thick first region of the stacked layered support body corresponding to the electronic components to be mounted on the base region, and aperture sections on the thick first region to be engaged with the protruded sections.

18. The method according to claim 12, further comprising mounting the electronic components face down.

19. The method according to claim 18, further comprising solder-bonding bump electrodes to mount the face down electronic components.

20. The method according to claim 12, further comprising forming the flexible circuit substrate out of a polyimide.

* * * * *